(12) United States Patent
Kang

(10) Patent No.: US 7,781,251 B2
(45) Date of Patent: Aug. 24, 2010

(54) IMAGE SENSOR AND METHOD FOR FABRICATING THE SAME

(75) Inventor: Jae Hyun Kang, Gyeonggi-do (KR)

(73) Assignee: Dongbu HiTek Co., Ltd, Seoul (KR)

( * ) Notice: Subject to any disclaimer, the term of this patent is extended or adjusted under 35 U.S.C. 154(b) by 931 days.

(21) Appl. No.: 11/567,008

(22) Filed: Dec. 5, 2006

(65) Prior Publication Data

US 2007/0126913 A1    Jun. 7, 2007

(30) Foreign Application Priority Data

Dec. 6, 2005  (KR) ................. 10-2005-0118088

(51) Int. Cl.
*H01L 21/00* (2006.01)
(52) U.S. Cl. .................. 438/70; 257/E27.133
(58) Field of Classification Search ............ 438/70, 438/72; 257/290–292, 294, E27.133, E27.134
See application file for complete search history.

(56) References Cited

U.S. PATENT DOCUMENTS

| 6,417,022 B1 * | 7/2002 | Hsiao et al. ............ 438/70 |
| 6,818,934 B1 | 11/2004 | Yamamoto |
| 6,821,810 B1 * | 11/2004 | Hsiao et al. ............ 438/69 |

FOREIGN PATENT DOCUMENTS

KR    1020050032867 A    4/2005

* cited by examiner

*Primary Examiner*—David Vu
(74) *Attorney, Agent, or Firm*—Sherr & Vaughn, PLLC

(57) ABSTRACT

Embodiments relate to an image sensor and a method of fabricating the same. In embodiments, the image sensor may include a semiconductor substrate having a photo detector, and a micro-lens array including lenses for guiding light incident from an exterior toward the photo detector, wherein the micro-lens array may include a dry film resist material. The dry film resist may include a polymer having a glass transition temperature of approximately 100° C. or less, and a molecular weight of approximately 10,000 or less.

7 Claims, 3 Drawing Sheets

IMAGE SENSOR AND METHOD FOR FABRICATING THE SAME

The present application claims priority under 35 U.S.C. 119 and 35 U.S.C. 365 to Korean Patent Application No. 10-2005-0118088 (filed on Dec. 6, 2005), which is hereby incorporated by reference in its entirety.

BACKGROUND

Embodiments relate to an image sensor having a micro-lens array and a method for fabricating the same. Embodiments may also relate to an image senor that may have a micro-lens array formed by using dry film resist and a method for fabricating the same.

An image sensor may be a semiconductor device for converting optical images into electric signals, and may mainly be classified as either a charge coupled device (CCD) image sensor or a complementary metal oxide semiconductor (CMOS) image sensor.

Various technologies have been developed for fabricating an image sensor to more precisely detect a quantity of light supplied from an exterior.

For instance, a CMOS image sensor may include a photo detector for detecting light and a logic circuit for converting detected light into electric signals that may represent the light is data. The photo detector may include a photodiode which may be formed by implanting low-density conductive impurities a semiconductor substrate.

When fabricating a CMOS image sensor including the photo detector and the logic circuit, a fill factor, which is a ratio of a photo detector area to the whole area of the image sensor, may be increased, which may improve a photo sensitivity of the image sensor.

However, since a photo detector may be formed on a specific area of a CMOS image sensor other than the logic circuit, it may be difficult to enlarge the photo detector area.

For this reason, various photo-gathering technologies have been studied with respect to changing a path of light incident to an area other than the photo detector area such that the light may be gathered in the photo detector. For example, a micro-lens array may be formed on a top surface of a color filter array of an image sensor to guide the light incident to an area other than the photo detector area toward the photo detector.

To fabricate a micro-lens array of an image sensor according to related art, a liquid-phase photoresist may be spin-coated on a color filter of the image sensor. A baking process may then be performed.

An exposure process may be performed, for example using defocus phenomenon. The photoresist may thereby be patterned in a form of a trapezoidal shape. Then, the photoresist pattern having the trapezoidal shape may be melted, for example by applying heat to the photoresist pattern up to a melting point, thereby reflowing the photoresist pattern.

The photoresist pattern that has been subjected to the reflow process may have a convex spherical shape. Then, the photoresist pattern having the convex spherical shape may be cured through a curing process to form the micro-lens array.

However, a process time of about 300 seconds per wafer may be required for reflowing and curing the photoresist pattern. Accordingly productivity of image sensor fabrication may be lowered.

In addition, in a micro-lens array obtained through the reflow process, it may be difficult to uniformly form the curvature of all lenses. Accordingly a performance of the micro-lens array may be degraded.

SUMMARY

Embodiments relate to an image sensor that may have a micro-lens array in which lenses have uniform surfaces.

Embodiments may also relate to a method capable of effectively fabricating an image sensor.

According to embodiments, an image sensor may include a semiconductor substrate having a photo detector, and a micro-lens array including lenses for guiding light incident from an exterior toward the photo detector, wherein the micro-lens array includes a dry film resist material.

According to embodiments, a method for fabricating an image sensor may include forming a photodiode, forming a protective layer such that the photodiode is covered with the protective layer, forming a color filter on the protective layer, forming a solid-phase photoresist film to the color filter, performing an exposure process with respect to the solid-phase photoresist film while gradually increasing quantity of light from a center portion to an edge portion of the photodiode, and developing the photoresist film, thereby forming a micro-lens having a spherical shape on the color filter.

DETAILED DESCRIPTION OF EMBODIMENTS

Figure 1:
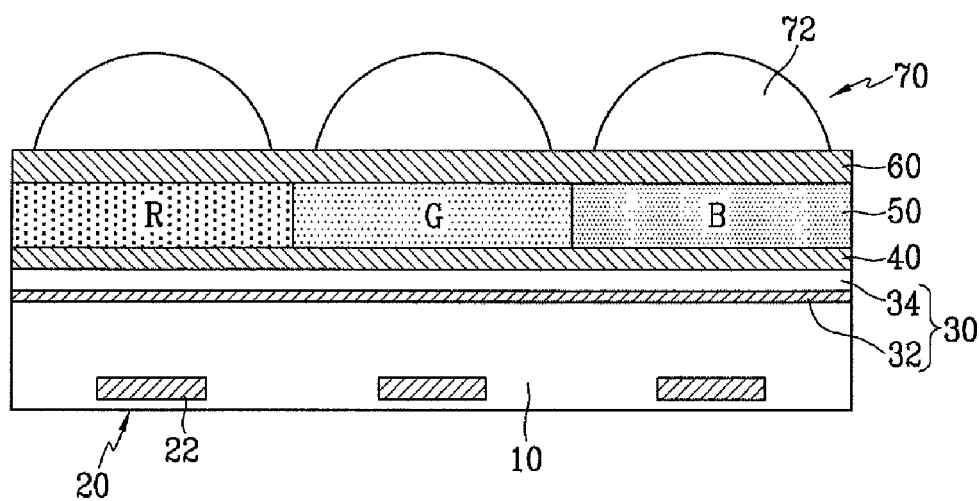
FIG. 1 is an example sectional view illustrating a structure of an image sensor according to embodiments.

Referring to FIG. 1, photo detector 20, which may include photodiodes 22, and which may receive external light to generate and accumulate electric charges, may be formed on a device area of a semiconductor substrate 10. Protective layer 30 may be formed on a top surface of photo detector 20 and may protect photo detector 20 from external moisture or scratches.

Protective layer 30 may include oxide layer 32 and/or nitride layer 34. Planar layer 40 may be formed on a top surface of nitride layer 34. However, in embodiments, planar layer 40 may not be formed on protective layer 30.

Color filter array 50, that may include red (R), green (G) and blue (B) color filters, may be formed on a top surface of planar layer 40, and OCM (Over Coat Material) layer 60 may be formed on a top surface of color filter array 50.

OCM layer 60 may be provided to compensate for a step difference of color filter array 50, to uniformly fabricate micro-lenses 72, and to adjust the focal length. According to embodiments, OCM layer 60 may include an insulating layer in the form of an oxide layer or a nitride layer.

Micro-lens array 70, which may include a plurality of micro-lenses 72, may be aligned on the OCM layer, and may thereby guide external light onto the color filters (in embodiments, the R, G and B color filters). According to embodiments, lens 72 may include a dry film resist 70' (FIG. 5) that may have photosensitive materials. According to embodiments, the dry film resist 70' of lens 72 may include a polymer having a glass transition temperature of approximately 100° C. or less, and a molecular weight of approximately 10000 or less.

Hereinafter, a method of fabricating an image sensor according to embodiments will be described. The image sensor, according to embodiments, may have the above described structure.

Figure 2:
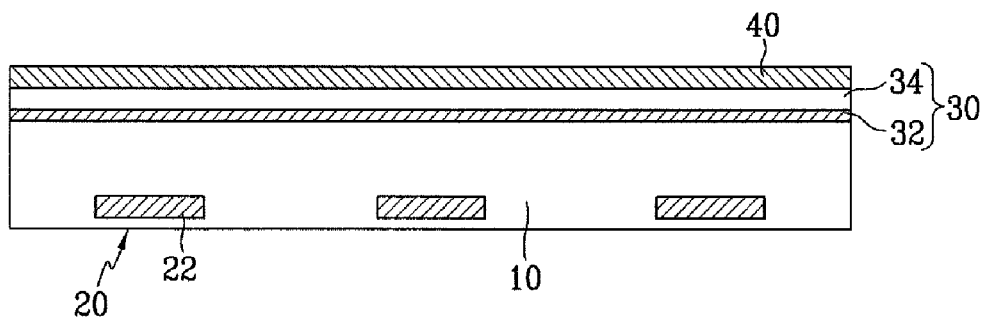
FIGS. 2 to 5 are example sectional views illustrating a procedure for fabricating a micro-lens array of an image sensor according to embodiments.

Referring to FIG. 2, oxide layer 32 and nitride layer 34 may be sequentially deposited on semiconductor substrate 10. Semiconductor substrate 10 may have photo detector 20 that may include photodiodes 22. Protective layer 30 may thereby be formed.

Planar layer 40 may be formed on a top surface of nitride layer 34, and may improve adhesive characteristics. In embodiments, planar layer 40 may be omitted.

Figure 3:
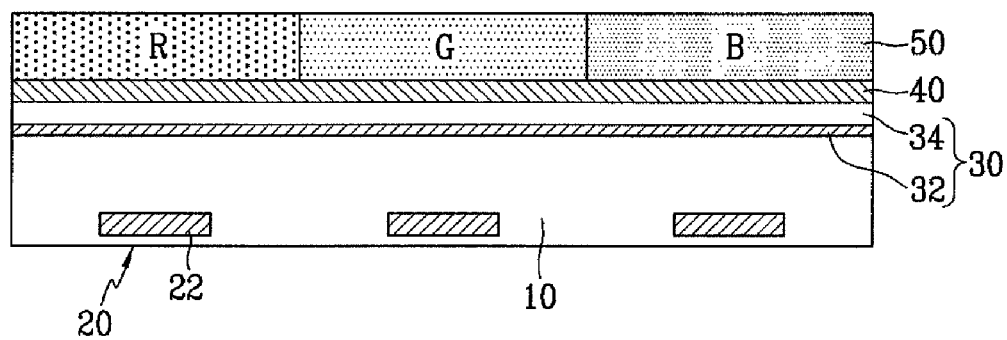

Referring to FIG. 3, color filter array 50 may be formed, for example on a top surface of planar layer 40. To form color filter array 50, photoresist including dye having specific colors (for example, red (R), green (G) and blue (B)) may be coated on the layer, for example on planar layer 40. An exposure and development process may be performed relative to the photoresist and may form color filters. In embodiments, the so formed color filters may be red (R), green (G) and blue (B) filters.

Figure 4:
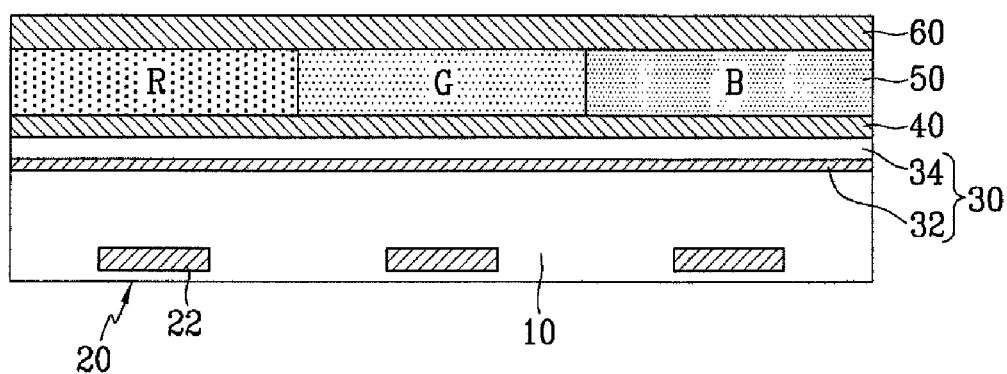

Referring to FIG. 4, OCM layer 60 may be formed on a top surface of color filter array 50 and may compensate for step difference of color filter array 50, to uniformly fabricate micro-lenses 72, and to adjust a focal length. In embodiments, OCM layer 60 may include an insulating layer in the form of an oxide layer or a nitride layer.

Figure 5:
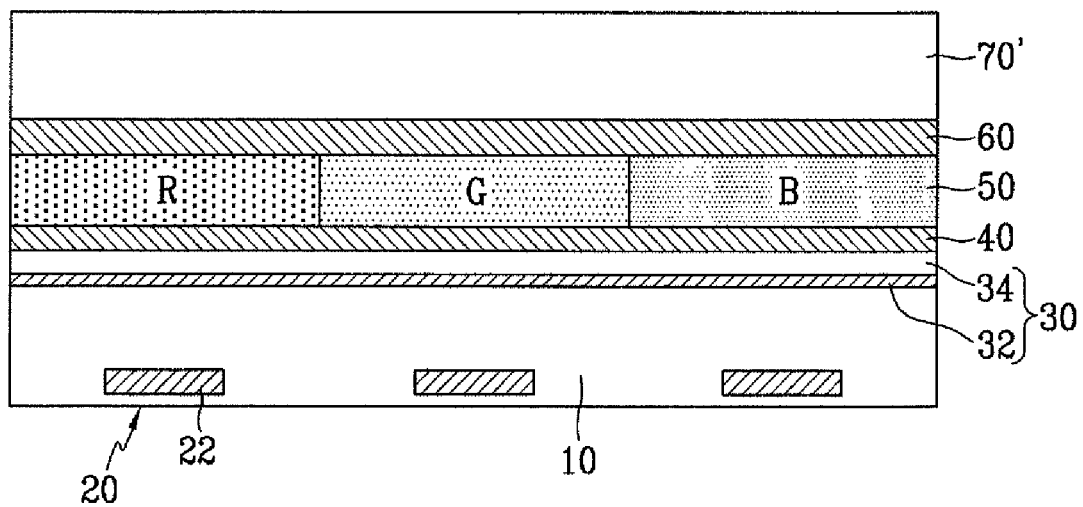

Referring to FIG. 5, a dry film resist 70' may be formed or attached to a surface of the OCM layer 60.

According to embodiments, dry film resist 70' may be obtained by coating resist on a base film (not shown).

Dry film resist 70' may be aligned on a top surface of OCM layer 60. According to embodiments, pressure may be applied to dry film resist 70' after dry film resist 701 has been aligned on the top surface of OCM layer 60. Dry film resist 70' may thereby be secured to OCM layer 60. In embodiments, dry film resist 70' may be attached to a top surface of OCM layer 60, for example through a taping scheme.

Dry film resist 70' may include a polymer having a glass transition temperature of approximately 100° C. or less, and a molecular weight of approximately 10000 or less.

After dry film resist 70' has been formed or attached on a surface of OCM layer 60, dry film resist 70' may be subjected to an exposure process. According to embodiments, dry film resist 70' may include positive type photosensitive materials that may represent a reduction of cross links when exposed to light.

When an exposure process is performed relative to dry film resist 70' employing the positive type photosensitive materials, a quantity of light may gradually increase from a center portion of dry film resist 70', which may correspond to a center portion of the photodiode, to an edge portion of dry film resist 70', which may correspond to an edge portion of the photodiode.

Referring again to FIG. 1, according to embodiments, since the development process may be performed after the above exposure process has been completed, it may be possible to form lens 72 having a substantially uniform curvature surface on a top surface of dry film resist 70' without performing an additional reflow process.

Accordingly, it may be possible to fabricate micro-lens array 70 having a substantially uniform curvature surface, for example by performing the exposure and development process relative to dry film resist 70' after forming dry film resist 70' on planar layer 60 through a thermal compression or taping scheme.

According to embodiments, a positive type photosensitive material may be used for dry film resist 70'. According to embodiments, dry film resist 70' may alternatively include negative type photosensitive materials that may generate cross links when exposed to light. If dry film resist 70' includes negative type photosensitive materials, when the exposure process is performed relative to dry film resist 70', a quantity of light may gradually decrease from a center portion of dry film resist 70', which may correspond to a center portion of the photodiode, to an edge portion of dry film resist 70', which may correspond to an edge portion of the photodiode. After that, the development process may be performed, and may cause dry film resist 70' to be patterned to have a lens shape having a substantially uniform curvature surface. According to embodiments, the micro-lens array 70 having a uniform curvature surface may be obtained even if the negative photoresist material is used for dry film resist 70'.

According to embodiments, a resist coating process may be simplified and a heating process for reflowing the photoresist may be omitted, so a fabricating procedure may be simplified and a process time may be shortened. Accordingly fabrication productivity of an image sensor may be improved, according to embodiments.

In addition, since a dry film resist may create a micro-lens array having a relatively large thickness, the lenses may have uniform curvature surfaces as compared a reflow phenomenon of photoresist.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
forming a photodiode;
forming a protective layer over the photodiode;
forming a color filter over the protective layer;
forming a solid-phase photoresist film over the color filter;
performing an exposure process with respect to the solid-phase photoresist film while gradually increasing a quantity of light from a center portion to an edge portion of the photodiode; and
developing the photoresist film to form a micro-lens having a substantially spherical shape over the color filter.

2. The method of claim 1, wherein the solid-phase photoresist film comprises a dry film resist layer.

3. The method of claim 1, wherein the photoresist film comprises a polymer having a glass transition temperature of 100° C. or less, and a molecular weight of 10000 or less.

4. The method of claim 1, wherein forming the solid-phase photoresist film over the color filter comprises applying pressure to the solid-phase photoresist film.

5. The method of claim 4, wherein the photoresist film is attached to the color filter using an adhesive.

6. The method of claim 1, wherein the photoresist film comprises positive type photosensitive materials that represent reduction of cross links when exposed to light.

7. The method of claim 1, wherein the photoresist film comprises negative type photosensitive materials that generate cross links when exposed to light.

* * * * *